United States Patent
Adkisson et al.

(10) Patent No.: US 9,343,589 B2
(45) Date of Patent: May 17, 2016

(54) FIELD EFFECT TRANSISTOR (FET) WITH SELF-ALIGNED DOUBLE GATES ON BULK SILICON SUBSTRATE, METHODS OF FORMING, AND RELATED DESIGN STRUCTURES

(71) Applicant: GLOBALFOUNDARIES INC., Grand Cayman (KY)

(72) Inventors: James W. Adkisson, Jericho, VT (US); James S. Dunn, Jericho, VT (US); Blaine J. Gross, Essex Junction, VT (US); David L. Harame, Essex Junction, VT (US); Qizhi Liu, Lexington, MA (US); John J. Pekarik, Underhill, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 40 days.

(21) Appl. No.: 14/160,630

(22) Filed: Jan. 22, 2014

(65) Prior Publication Data

US 2015/0206961 A1 Jul. 23, 2015

(51) Int. Cl.
| | |
|---|---|
| *H01L 29/808* | (2006.01) |
| *H01L 21/28* | (2006.01) |
| *H01L 21/8232* | (2006.01) |
| *H01L 29/47* | (2006.01) |
| *H01L 29/66* | (2006.01) |
| *H01L 29/06* | (2006.01) |
| *G06F 17/50* | (2006.01) |
| *H01L 21/306* | (2006.01) |

(52) U.S. Cl.
CPC ........ *H01L 29/808* (2013.01); *H01L 21/28026* (2013.01); *H01L 21/8232* (2013.01); *H01L 29/0657* (2013.01); *H01L 29/47* (2013.01); *H01L 29/475* (2013.01); *H01L 29/66901* (2013.01); *H01L 29/66924* (2013.01); *G06F 17/5045* (2013.01); *H01L 21/306* (2013.01)

(58) Field of Classification Search
None
See application file for complete search history.

(56) References Cited

U.S. PATENT DOCUMENTS

| | | | |
|---|---|---|---|
| 7,402,875 B2 | 7/2008 | Datta et al. | |
| 7,473,947 B2 | 1/2009 | Murthy et al. | |
| 7,888,743 B2* | 2/2011 | Anderson | H01L 29/66795 257/213 |
| 7,936,006 B1 | 5/2011 | Luo et al. | |
| 7,936,956 B2 | 5/2011 | Marttila et al. | |
| 9,059,233 B2* | 6/2015 | Leidy | H01L 29/7371 |
| 9,059,234 B2* | 6/2015 | Benoit | H01L 29/7378 |
| 2002/0093053 A1* | 7/2002 | Chan | H01L 21/76251 257/347 |
| 2005/0073005 A1* | 4/2005 | Nowak | H01L 21/84 257/347 |
| 2009/0079004 A1* | 3/2009 | Licitra | H01L 29/42384 257/365 |
| 2009/0302348 A1 | 12/2009 | Adam et al. | |
| 2012/0168775 A1 | 7/2012 | Faltermeier et al. | |
| 2012/0319166 A1 | 12/2012 | Adam et al. | |
| 2012/0326168 A1 | 12/2012 | Adam et al. | |
| 2013/0140629 A1 | 6/2013 | Grupp et al. | |

FOREIGN PATENT DOCUMENTS

JP 1092846 A 4/1998

* cited by examiner

*Primary Examiner* — Andres Munoz
(74) *Attorney, Agent, or Firm* — Anthony Canale; Hoffman Warnick LLC

(57) ABSTRACT

At least one isolation trench formed in a layer stack including substrate, channel, and upper gate layers define a channel in the channel layer. Lateral etching from the isolation trench(es) can form lateral cavities in the substrate and upper gate layer to substantially simultaneously form self-aligned lower and upper gates. The lower gate undercuts the channel, the upper gate is narrower than the channel, and a source and a drain can be formed on opposed ends of the channel. As a result, source-drain capacitance and gate-drain capacitance can be reduced, increasing speed of the resulting FET.

16 Claims, 9 Drawing Sheets

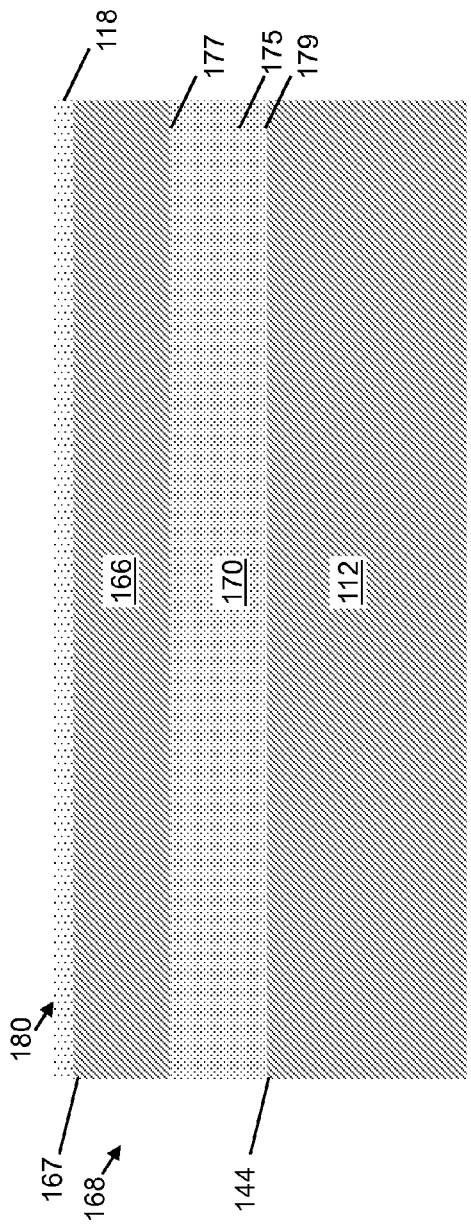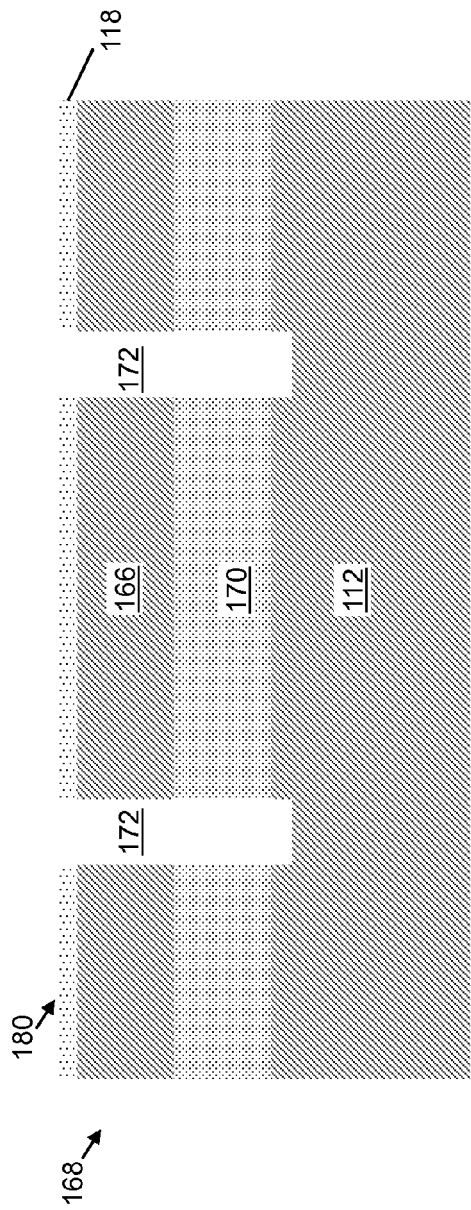

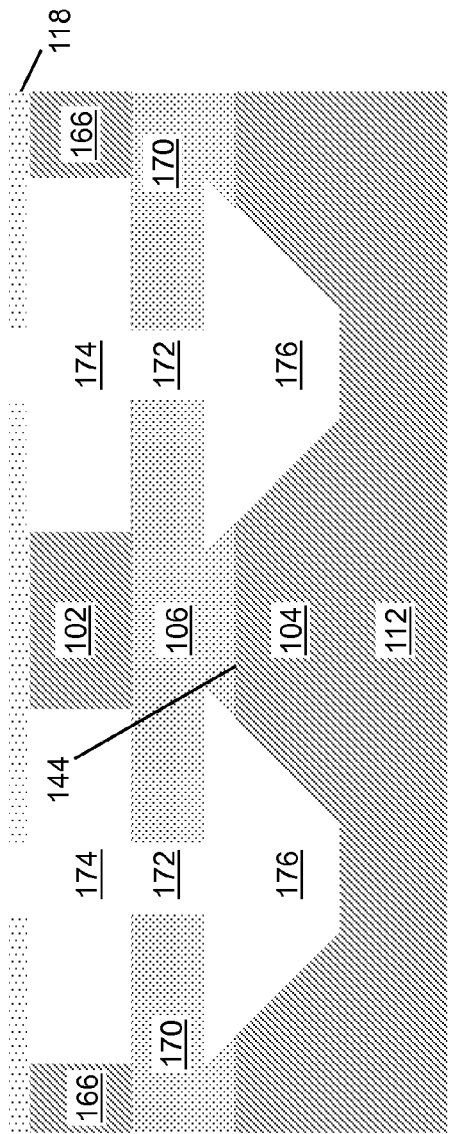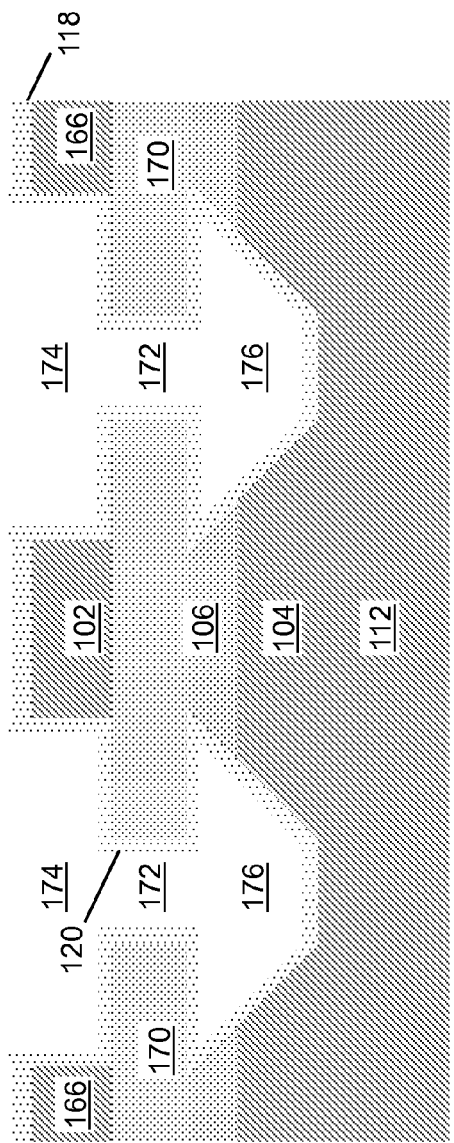

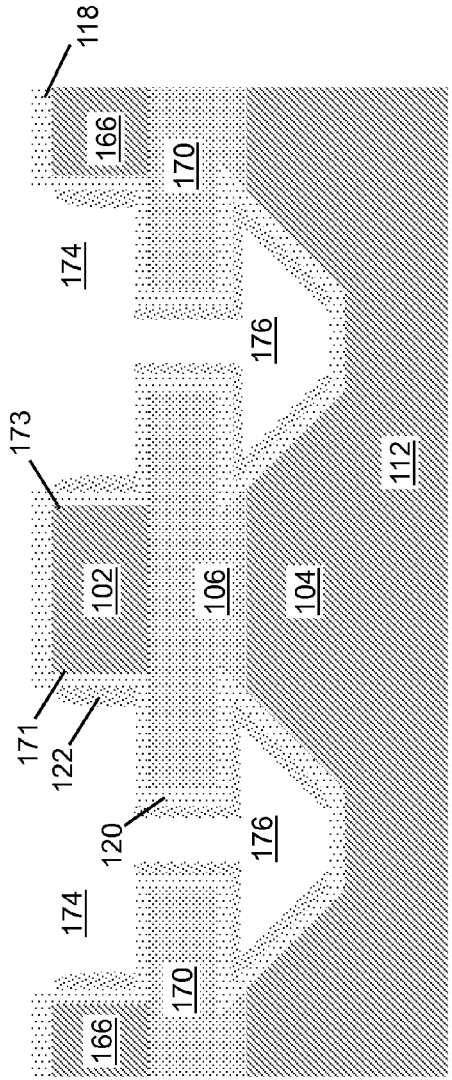
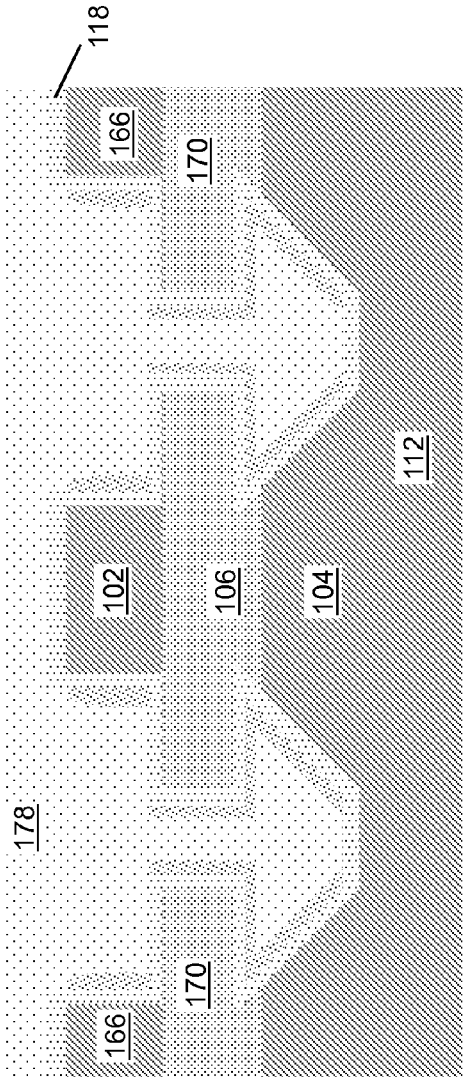

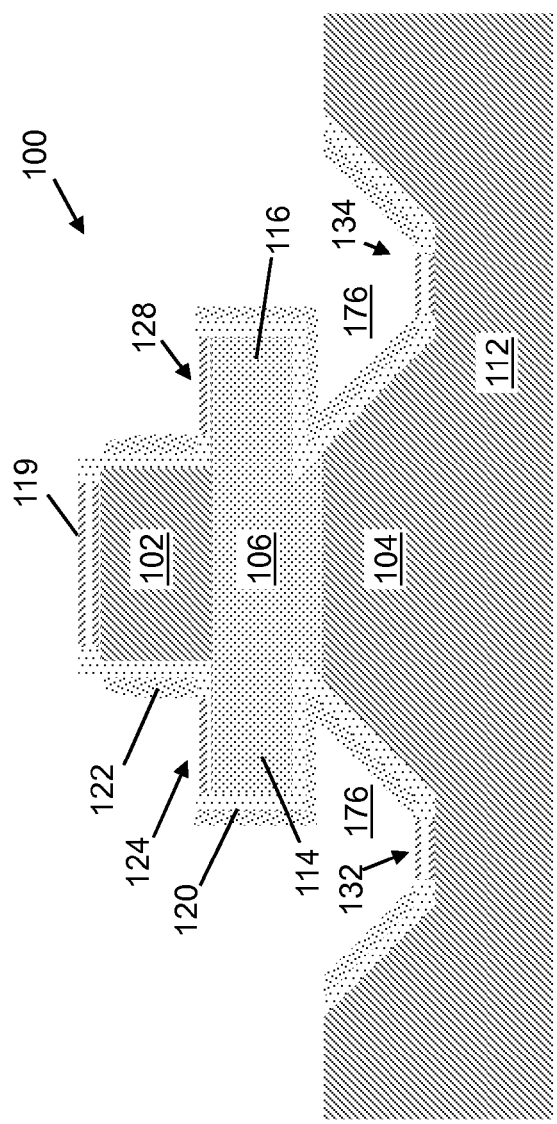
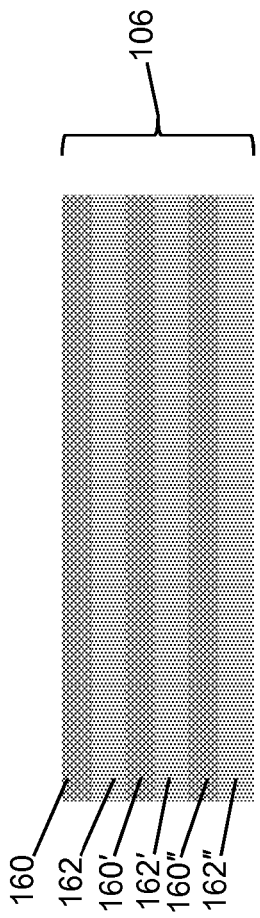
FIG. 8
FIG. 9

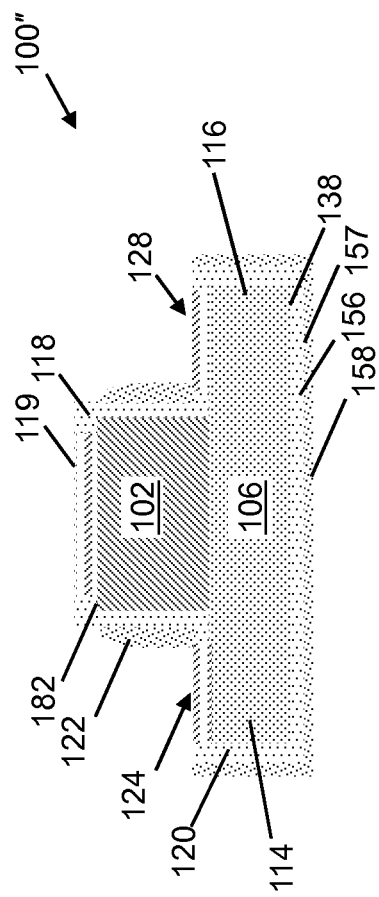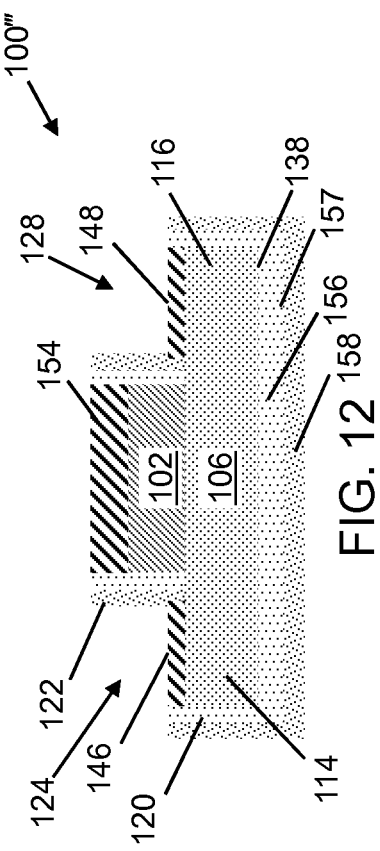

FIELD EFFECT TRANSISTOR (FET) WITH SELF-ALIGNED DOUBLE GATES ON BULK SILICON SUBSTRATE, METHODS OF FORMING, AND RELATED DESIGN STRUCTURES

BACKGROUND

The invention relates generally to semiconductor structures and fabrication of semiconductor chips and, in particular, to the fabrication of field effect transistors (FETs) in bulk silicon (Si) substrates. More particularly, aspects of the invention relate to fabrication of junction gate FETs (JFETs) and metal-semiconductor field effect transistors (MESFETs) with self-aligned double gates on and/or in bulk Si substrates.

In fabricating dual-gate FETs, it can be difficult to ensure proper alignment of the gates. As a result, fabrication yield can suffer, increasing costs and time to delivery. Further, conventional dual-gate FETs, typically formed as junction gate FETs (JFETs), can have excessive gate-drain and/or gate-source capacitances, which can increase power consumption and/or threshold voltage of the FET.

SUMMARY

An embodiment of the invention disclosed herein can take the form of a method of fabricating a field effect transistor (FET), including substantially simultaneously forming at least an upper gate in an upper gate layer of a layer stack and a lower gate in a substrate layer of the layer stack in substantial self-alignment with the upper gate.

Another embodiment of the invention disclosed herein can take the form of a field effect transistor (FET), such as an upper gate and a lower gate below and substantially self-aligned with the upper gate. A channel between a bottom of the upper gate and a top of the lower gate can have opposed ends extending beyond the bottom of the upper gate and the top of the lower gate, bottoms of the opposed ends of the channel being undercut by respective cavities that bound sides of the lower gate. A source can be formed on a top of a first of the opposed ends of the channel, and a drain can be formed on a top of a second of the opposed ends of the channel.

A further embodiment of the invention disclosed herein can take the form of a design structure readable by a machine used in design, manufacture, or simulation of an integrated circuit, the design structure including an upper gate and a lower gate below and substantially self-aligned with the upper gate. A channel between a bottom of the upper gate and a top of the lower gate can have opposed ends extending beyond the bottom of the upper gate and the top of the lower gate, bottoms of the opposed ends of the channel being undercut by respective cavities that bound sides of the lower gate. A source can be formed on a top of a first of the opposed ends of the channel, and a drain can be formed on a top of a second of the opposed ends of the channel.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features and advantages of the invention are apparent from the following detailed description taken in conjunction with the accompanying drawings.

FIG. 2 is a schematic cross sectional illustration of a stage of fabrication of a dual-gate FET according to embodiments of the invention disclosed herein.

FIG. 3 is a schematic cross sectional illustration of another stage of fabrication of a dual-gate FET according to embodiments of the invention disclosed herein.

FIG. 4 is a schematic cross sectional illustration of another stage of fabrication of a dual-gate FET according to embodiments of the invention disclosed herein.

FIG. 5 is a schematic cross sectional illustration of another stage of fabrication of a dual-gate FET according to embodiments of the invention disclosed herein.

FIG. 6 is a schematic cross sectional illustration of another stage of fabrication of a dual-gate FET according to embodiments of the invention disclosed herein.

FIG. 7 is a schematic cross sectional illustration of another stage of fabrication of a dual-gate FET according to embodiments of the invention disclosed herein.

FIG. 8 is a schematic cross sectional illustration of another stage of fabrication of a dual-gate FET according to embodiments of the invention disclosed herein.

FIG. 9 is a schematic cross sectional illustration of a multiple quantum well channel usable in a FET according to embodiments of the invention disclosed herein.

FIG. 11 is a schematic cross sectional illustration of another FET according to embodiments of the invention disclosed herein.

FIG. 12 is a schematic cross sectional illustration of another FET according to embodiments of the invention disclosed herein.

DETAILED DESCRIPTION

In the following description, various components will be described in various stages of fabrication of embodiments of the inventive dual self-aligned gate field effect transistor (FET) disclosed herein, and it is well within the purview of one of ordinary skill in the semiconductor manufacturing arts to choose appropriate techniques and/or processes for the fabrication of the various components and to achieve intermediate states between the various stages shown and described. Examples of semiconductor fabrication techniques that can be employed in various stages include shallow trench isolation (STI), deposition processes, such as, for example, physical vapor deposition (PVD), chemical vapor deposition (CVD), electrochemical deposition (ECD), molecular beam epitaxy (MBE), and atomic layer deposition (ALD); removal processes, such as, for example, wet etching, dry etching, and chemical-mechanical planarization (CMP); patterning/lithography, such as photomasking, exposing, and/or ashing; and/or electrical property modification, such as by doping by diffusion, ion implantation, dielectric constant reduction via ultraviolet light exposure, and/or annealing.

Embodiments of the invention as disclosed herein and/or in accordance with the teachings herein can include substantially simultaneously formed and self-aligned upper and lower gate structures in a field effect transistor (FET) and/or other semiconductor device and/or structure. Advantageously, embodiments can be used to form junction gate field effect transistors (JFETs), metal oxide semiconductor field effect transistors (MOSFETs), and/or metal-semiconductor field effect transistors (MESFETs) with reduced parasitic capacitances and improved performance. In addition, the teachings herein may additionally be used in the fabrication of various types of heterojunction FETs (HFETs) and could be used in additional semiconductor structures as are now known and/or may be developed in the future. Inasmuch as JFETs, MOSFETs, MESFETs, and HFETs are well understood by those skilled in the art, any omitted details regarding what materials should be used and in what manner are viewed as general knowledge in the art and/or items that can be learned without undue experimentation by one skilled in the art.

Figure 1:
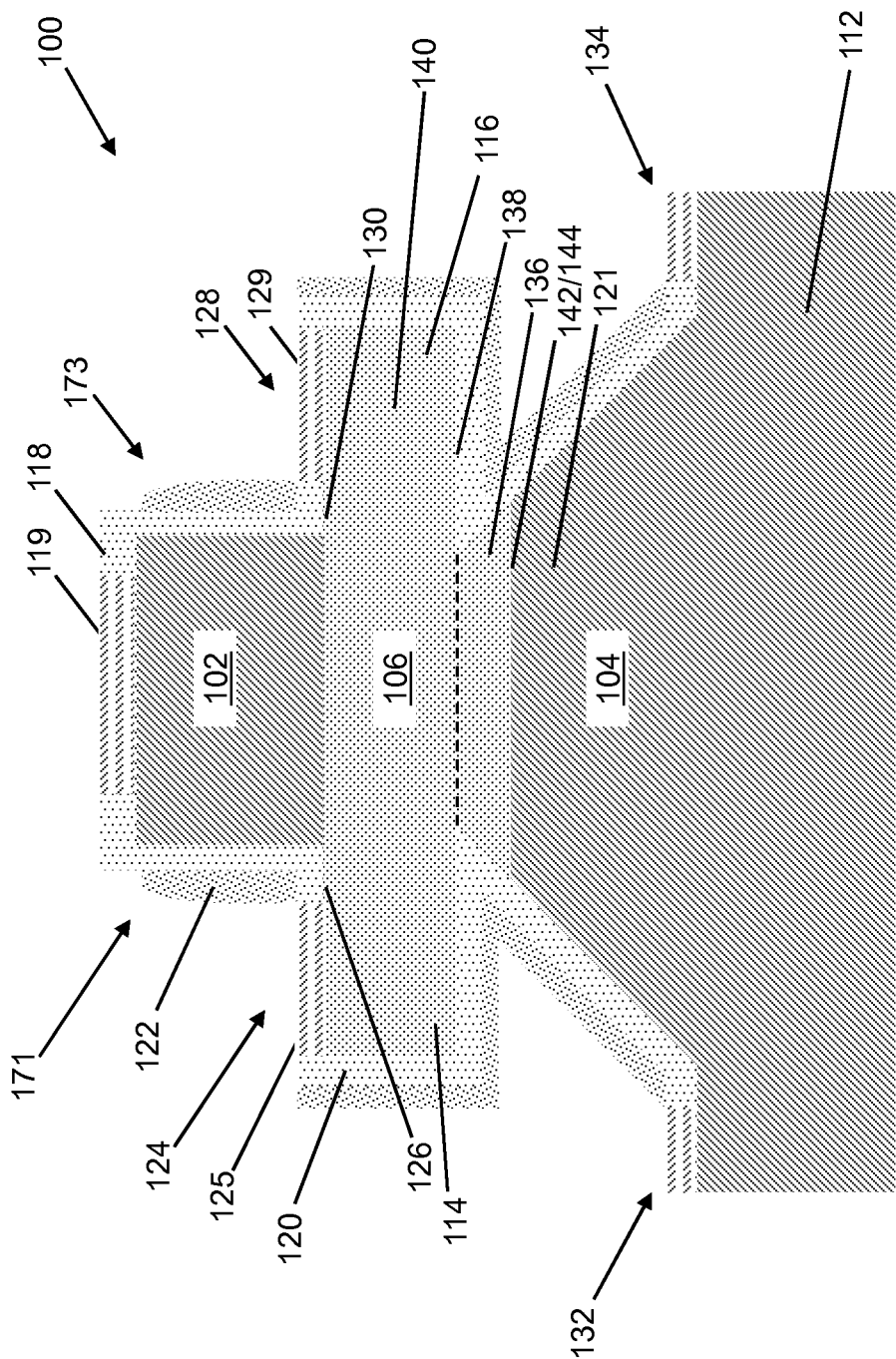
FIG. 1 is a schematic cross sectional illustration of a dual-gate FET according to embodiments of the invention disclosed herein.

With reference to FIG. 1, a dual-gate FET 100 can include an upper gate 102, a lower gate 104 below and substantially aligned with upper gate 102, and a channel 106 between a bottom 108 of upper gate 102 and a top 110 of lower gate 104. By virtue of the teachings herein, upper gate 102 and lower gate 104 can be formed substantially simultaneously in substantial self-alignment. Thus, one or both of upper gate 102 and lower gate 104 can be formed as a self-aligned gate. FET 100 is shown substantially as a JFET in FIG. 1, but the teachings herein can be applied to any suitable semiconductor structure. Opposed ends 114, 116 of channel 106 can extend beyond the bottom 108 of upper gate 102 and the top 110 of lower gate 104. Channel 106 can include one or more layers of insulative material 120 on opposed ends 114, 116 thereof, which can be formed at the same time as insulative material 118 in embodiments. Some embodiments can further include a spacer layer 122 formed on ends of upper gate 102.

In embodiments, lower gate 104 can include bulk silicon, such as a modified bulk silicon substrate or other substrate or lower gate layer 112. Channel 106 can include any suitable semiconductor material, such as Si, germanium (Ge), gallium arsenide (GaAs), and/or indium (In), and/or any combination thereof and/or including other materials as may be appropriate. A source 124 can be formed at first end 114 of channel 104 and can have a contact 125 formed on a top 126 of first end 114 through insulative material 120. Likewise, a drain 128 can be formed at second end 116 of channel 106 and can have a contact 129 formed on a top 130 of second end 116 through insulative material 120. In addition, if needed and/or desired, lower gate 104 can include contacts 132, 134 to allow and/or enhance use thereof. Source 124, drain 128, and contacts 132, 134 can include any suitable material and/or can be formed by any suitable method or technique now known in the art or later discovered, so long as appropriate biased P-N or N-P junctions can be established between upper gate 102 and channel 106, and/or between lower gate 104 and channel 106, where FET 100 is a JFET. For example, an upper region of channel 106 beneath upper gate 102 can be doped to produce such a junction. The same or similar could be done to lower gate 104, though this would be far easier to do before deposition of the layer of material used to form channel 106, as will be shown below. If needed, formation of source 124 and/or drain 128 can also include doping of their respective ends 114, 116 of channel 106.

As can be seen in FIG. 5, channel 106 can include a lower portion 136 having a substantially trapezoidal cross section extending from a bottom 138 of an upper portion 140 of channel 106, a bottom 142 of lower portion 136 meeting and being of substantially identical dimension to a top 144 of lower gate 104, wider than a top 146 of lower portion 136, and narrower than bottom 138 of upper portion 140. Thus, channel 106 at opposed ends 114, 116 is undercut by lower gate 104.

A method of fabricating a field effect transistor (FET) such as that described above can include, with additional reference to FIG. 2, forming or acquiring an initial layer stack 168. Initial layer stack 168 in embodiments can include substrate or lower gate layer 112, a channel layer 170 thereon, and an upper gate layer 166 above and/or on channel layer 170. It should be recognized that the particular order of layer formation can differ from the order in which the layers are described above. For example, it may make more sense to form channel layer 170 on substrate or lower gate layer 112 in an initial layer stack 168 as illustrated in FIG. 2, then form upper gate layer 166 on channel layer 170 and apply first insulative layer 118 as shown in FIG. 7. Further, various additional layers can be included between layers of and/or atop layer stack 168 as may be desired and/or appropriate to form a particular FET. For example, in embodiments, substrate or lower gate layer 112 can include a bulk silicon (Si) substrate and can include a layer of N-type semiconductor formed on a top surface 144 of substrate or lower gate layer 112, such as by epitaxial deposition. Where such a layer is formed atop substrate or lower gate layer 112, it can have a thickness adjusted to provide a good emitter-base junction, such as on the order of 0.1 microns. Alternatively, doping can be used to alter the properties of the upper regions of substrate or lower gate layer 112.

Channel layer 170 in embodiments can be formed, for example, through low-temperature epitaxy and can include, particularly where a JFET is being formed, SiGe in a thickness of about 300 nanometers (nm), though other thicknesses can be used if desired and/or appropriate. Upper gate layer 166 can then be formed atop channel layer 170 using any suitable method, such as to a thickness of about 300 nm. In embodiments, a lower portion 175 of channel layer 170 can be heavily doped to ensure a satisfactory junction between channel layer and substrate or lower gate layer 112, while a top surface 177 thereof can be undoped. The concentration of an impurity used in doping channel layer 170 can change gradually between its initial heavy doping at a bottom 179 of channel layer 170 and its lack of doping at top 177 of channel layer 170, though embodiments can also have stepped or sudden changes in concentration. Oxide layer 118 can then be formed on top surface 167 of upper gate layer 160, such as by any suitable method of deposition or formation as is known in the art, and can have a thickness on the order of 60 nm in embodiments. Alternatively, such as where a JFET is to be produced, further doping can be performed on upper gate layer 166 to ensure a satisfactory junction between upper gate layer 166 and channel 170.

Turning now to FIG. 3, the forming of upper gate 102 (FIG. 1) can include forming at least one isolation trench 172 extending from a top 180 of the layer stack 168 through at least upper gate layer 166 and any intervening layer, such as insulative layer 118 and/or any other layer therebetween. For example, at least one isolation trench 172 can extend at least along two substantially parallel opposed sides of upper gate 102 and/or a desired location of upper gate 102 in upper gate layer 166. Any suitable method can be employed to form trench(es) 172, such as by applying and patterning photosensitive material and etching through as many layers as may be suitable and/or desired. In embodiments, a single isolation trench 172 of any suitable shape can surround a desired location of upper gate 102 (FIG. 1), an opposed pair of isolation trenches can be formed on opposite sides of a desired location of upper gate 102 (FIG. 1), and/or multiple pairs of opposed trenches arranged with a suitable substantially polygonal footprint around a desired location of upper gate 102 can be used, such as two pairs of opposed trenches arranged with a substantially rectangular footprint, as should be within the ken of one skilled in the art.

A lateral etch can be performed through isolation trench(es) 172 as seen in FIG. 4 to form a respective upper lateral cavity 174 in upper gate layer 166 and can also be used to form a respective lower lateral cavity 176 in substrate or lower gate layer 112. In embodiments, each lower lateral cavity 176 can undercut a respective end 114, 116 of channel 106 such that a top 144 of lower gate 104 is narrower than channel 106. For example, an undercut of at least about 0.4 microns can be created, which undercut can enhance performance of the final FET, such as by reducing gate-source and/or gate-drain capacitance. In embodiments, channel layer 170 and/or channel 106 can be doped and/or implanted with at least one impurity to enhance performance of channel 106 and the FET as a whole. In additional embodiments, a material of upper gate layer 166 can have a lateral etch rate that is substantially higher than a lateral etch rate of a material of lower gate layer 112. For example, upper gate layer 166 can include single crystal silicon while lower gate layer 112 can include bulk silicon and/or polysilicon. By performing a lateral etch from opposed sides of a desired location of upper gate 102 and lower gate 104, the gates 102, 104 can be substantially self-aligning, such that they can be substantially simultaneously formed in self-alignment with each other. In other words, lower gate 104 can be in substantial self-alignment and/or can be substantially self-aligned with upper gate 102.

Referring now to FIG. 5, fabrication of an FET according to embodiments can additionally include removing any remaining portions of insulative layer 118 from above upper lateral cavities 174 and can include passivation of sidewalls, such as by depositing or otherwise forming one or more layers of insulative material 120 on surfaces of trenches 172, cavities 174, 176, and/or other surfaces as may be appropriate. As a result, upper gate 102, lower gate 104, and channel 106 are substantially defined, as shown in FIG. 6. In addition, as shown in FIG. 6, a layer of spacer material 122, such as a nitride, can be formed or deposited and/or etched, such as on ends 171, 173 of upper gate 102, as well as in any other suitable location as may be desired. Photosensitive material 178 can then be deposited to protect contact regions of gates 102, 104 and channel 106, though in embodiments can be applied over the entire fabrication to fill all cavities and cover any exposed surfaces as shown in FIG. 7. Photosensitive material 178 can then be patterned so that excess portions of upper gate layer 166, lower gate layer 112, channel layer 170, and any other layers can be removed, as illustrated in FIG. 8, such as by reactive ion etching (RIE) or any other suitable technique. If silicide(s) remain after removal of photosensitive material 178 and/or RIE, such silicidation is harmless and can be left in place. Lower lateral cavities 176 can be filled with a barrier nitride layer and borophosphosilicate glass (BPSG) for contact formation during mid-end of line (MEOL) fabrication processes.

In embodiments, with additional reference to FIGS. 1 and 9, performance of FET 100 can be enhanced by forming a plurality of quantum wells in channel 106. For example, as illustrated in FIG. 9, channel 106 can include alternating layers of a first semiconductor material 160, 160', 160" and a second semiconductor material 162, 162', 162" to form a plurality of quantum wells. It should be recognized that while two different semiconductor materials can be used in alternating layers, three or more different materials could be used if desired and/or suitable. Examples of semiconductor materials that can be used include silicon (Si) and germanium (Ge), and in embodiments, the first semiconductor can include silicon (Si) and the second semiconductor material can include silicon germanium (SiGe). Additionally, the layers can include doped semiconductor material to form separately-doped channel layers using, for example, silicon (Si) doped with an impurity, such as any suitable impurity and/or in any suitable concentration as may known to those skilled in the art. Such layers can be formed by implantation or other manipulation of channel layer 170 and/or channel 106. In the example shown in FIG. 9, embodiments can include alternating layers of Si 160, 160', 160" and SiGe 162, 162', 162" to produce multiple quantum wells in channel layer 170 and/or channel 106.

Figure 10:
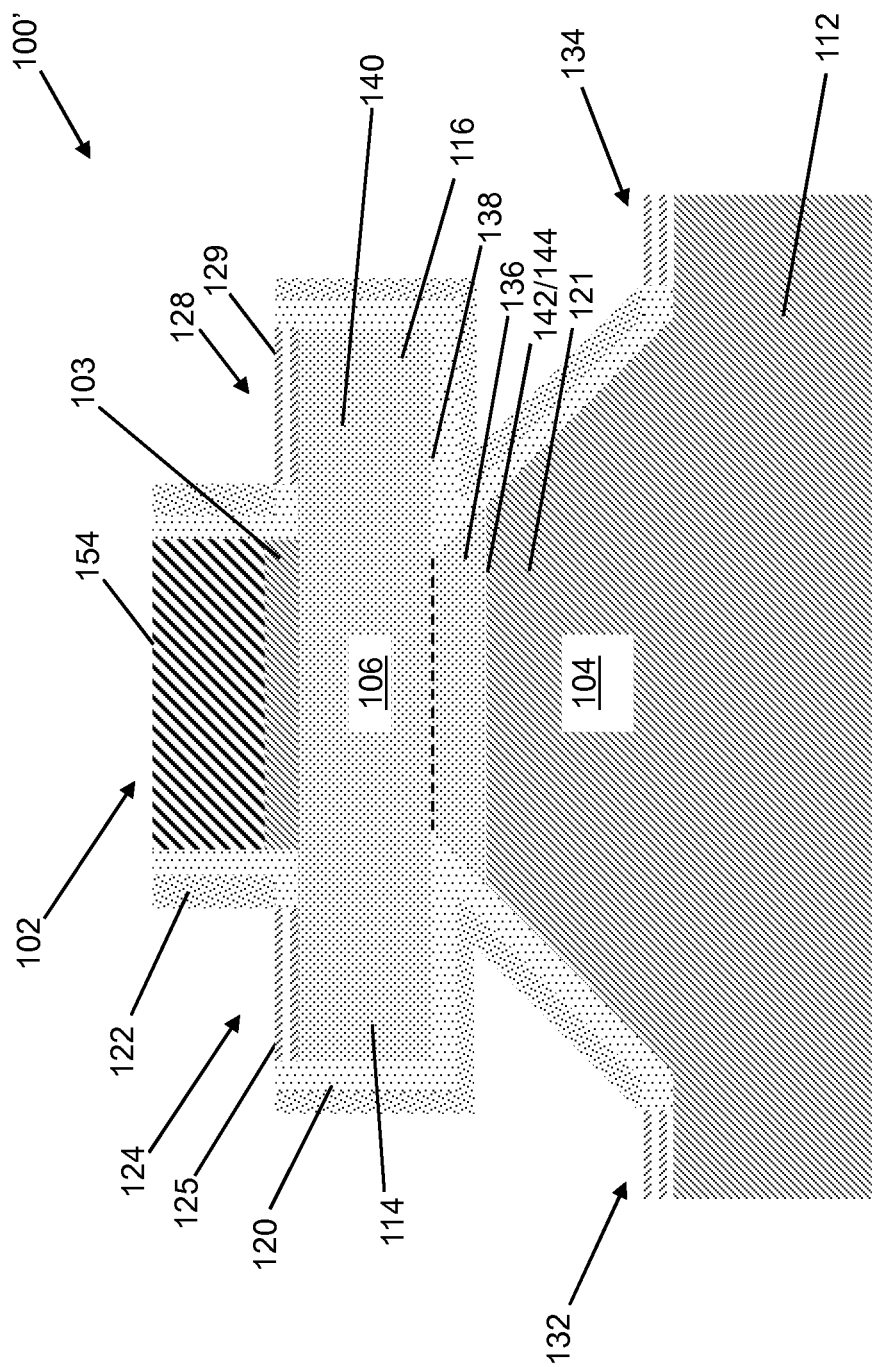
FIG. 10 is a schematic cross sectional illustration of another dual-gate FET according to embodiments of the invention disclosed herein.

With additional changes in fabrication process steps of embodiments, the teachings herein can be used to form, as seen in FIG. 10 a MESFET-based HFET 100'. In HFET 100', drawing on MESFET technology, upper gate 102 can include a Schottky barrier 103 between contact material 154 and channel 106, lower gate 104 remaining JFET-based. In embodiments, channel 106 can include a layer of SiGe, which can both act as the channel layer for upper gate 102 and form a suitable junction with lower gate 104, which can enhance function of FET 100', save material cost, and/or be advantageous in BiCMOS fabrication techniques.

Dual-gate FETs according to embodiments can be employed as mixer structures with self-aligned gates. For example, with reference to either FIG. 1 or FIG. 10, a first signal can be provided to upper gate 102, while a second signal can be provided to lower gate 104, and combined output can be obtained, for example, through drain 128. Typically, upper gate 102 will be faster than lower gate 104, and so a higher frequency signal can be applied thereto, such as a radio frequency signal, while a slower or lower frequency signal can be applied to lower gate 104.

Dual gate FETs formed according to embodiments, such as JFET-based HFET 100 of FIG. 1 and JFET/MESFET HFET 100' of FIG. 10, can be an intermediate step toward fabrication of single gate FETs. For example, as shown in FIG. 11 and with reference to FIG. 1, lower gate 106 can be removed, and one or more insulative layers 156, 158 can extend along bottom 138 of channel 106. The example of FIG. 11 can take the form of a JFET 100" though, as additionally seen in FIG. 12 with additional reference to FIG. 10, can alternatively take the form of a single gate MESFET 100'''.

In embodiments such as those shown in FIGS. 11 and 12, substrate or lower gate layer 112 and/or lower gate 104 can be removed to expose a bottom surface 138 of channel 106, insulative material 156 can be deposited on bottom surface 138 of channel 106, and spacer material 158 can be deposited on a bottom surface 157 of insulative material 156. Additional insulative material can also be deposited on a bottom surface of spacer material 158 as may be desired and/or appropriate (not shown). Further, as shown in FIG. 12, a first metal material 154 can be deposited on a top surface 182 of upper gate 102, such as after removing insulative material layer 118 therefrom. A second metal material 146 can be deposited on top surface 126 of source end 114 of channel 106, and a third metal material 148 can be deposited on a top surface 130 of drain end 116 of channel 106.

By employing the teachings according to embodiments of the invention disclosed herein, a dual-gate FET can be substantially simultaneously formed in such a way that the upper and/or lower gates can be self-aligned gate, greatly improving performance and reducing failure rate during fabrication. Further, by employing multiple quantum wells as disclosed above, performance of an FET can be significantly enhanced.

Figure 13:
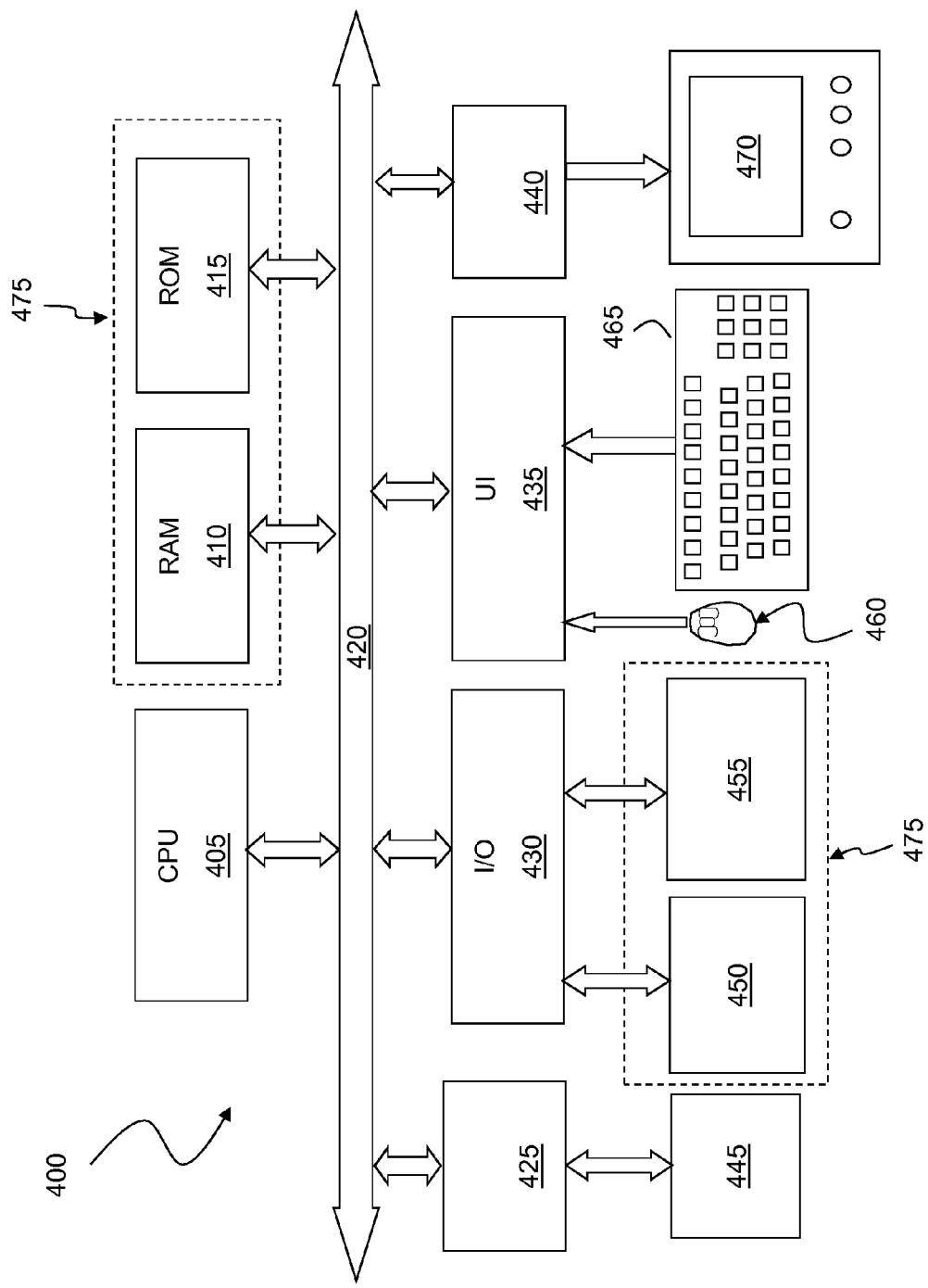
FIG. 13 is a schematic block diagram of a general purpose computer system which may be used to practice aspects of embodiments of the invention disclosed herein.

A dual-gate FET according to embodiments of the invention disclosed herein may be implemented as a circuit design structure. FIG. 13 illustrates a block diagram of a general-purpose computer system which can be used to implement the circuit and circuit design structure described herein. The design structure may be coded as a set of instructions on removable or hard media for use by general-purpose computer. FIG. 13 is a schematic block diagram of a general-purpose computer for practicing the present invention. FIG. 13 shows a computer system 400, which has at least one microprocessor or central processing unit (CPU) 405. CPU 405 is interconnected via a system bus 420 to machine readable media 475, which includes, for example, a random access memory (RAM) 410, a read-only memory (ROM) 415, a removable and/or program storage device 455 and a mass data and/or program storage device 450. An input/output (I/O) adapter 430 connects mass storage device 450 and removable storage device 455 to system bus 420. A user interface 435 connects a keyboard 465 and a mouse 460 to system bus 420, and a port adapter 425 connects a data port 445 to system bus 420 and a display adapter 440 connect a display device 470. ROM 415 contains the basic operating system for computer system 400. Examples of removable data and/or program storage device 455 include magnetic media such as floppy drives, tape drives, portable flash drives, zip drives, and optical media such as CD ROM or DVD drives. Examples of mass data and/or program storage device 450 include hard disk drives and non-volatile memory such as flash memory. In addition to keyboard 465 and mouse 460, other user input devices such as trackballs, writing tablets, pressure pads, microphones, light pens and position-sensing screen displays may be connected to user interface 435. Examples of display device 470 include cathode-ray tubes (CRT) and liquid crystal displays (LCD).

A machine readable computer program may be created by one of skill in the art and stored in computer system 400 or a data and/or any one or more of machine readable medium 475 to simplify the practicing of this invention. In operation, information for the computer program created to run the present invention is loaded on the appropriate removable data and/or program storage device 455, fed through data port 445 or entered using keyboard 465. A user controls the program by manipulating functions performed by the computer program and providing other data inputs via any of the above mentioned data input means. Display device 470 provides a means for the user to accurately control the computer program and perform the desired tasks described herein.

Figure 14:
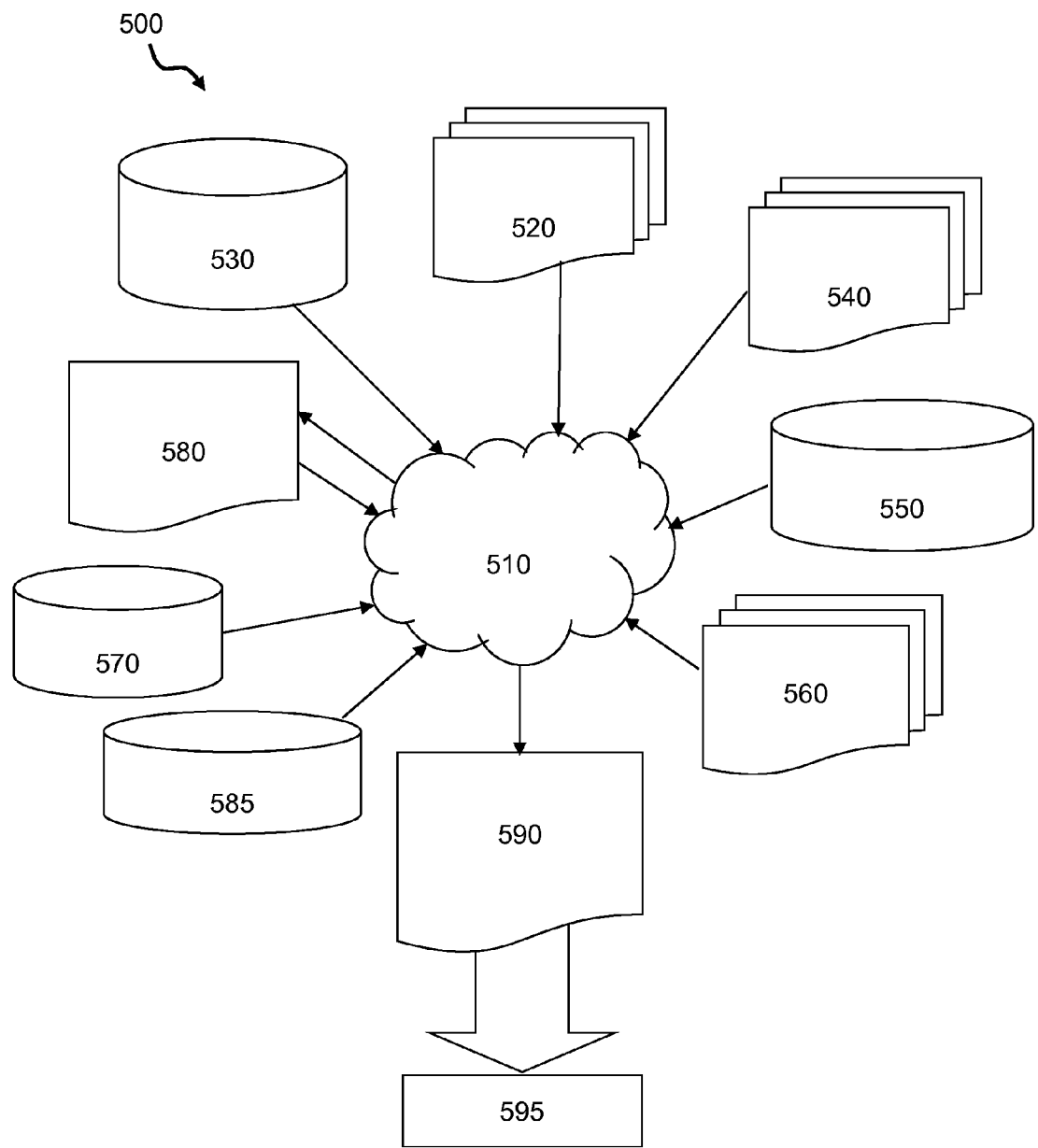
FIG. 14 is a schematic flow diagram of a design process used in semiconductor design, manufacturing, and/or test that may be applied to aspects of embodiments of the invention disclosed herein.

FIG. 14 shows a block diagram of an example design flow 500. Design flow 500 may vary depending on the type of IC being designed. For example, a design flow 500 for building an application specific IC (ASIC) may differ from a design flow 500 for designing a standard component. Design structure 520 is preferably an input to a design process 510 and may come from an IP provider, a core developer, or other design company or may be generated by the operator of the design flow, or from other sources. Design structure 520 can comprise dual-gate FET 100 in the form of schematics or HDL, a hardware-description language (e.g., Verilog, VHDL, C, etc.). Design structure 520 may be contained on one or more machine readable medium. For example, design structure 520 may be a text file or a graphical representation of dual-gate FET 100. Design process 510 preferably synthesizes (or translates) dual-gate FET 100 into a netlist 580, where netlist 580 is, for example, a list of wires, transistors, logic gates, control circuits, I/O, models, etc., that describes the connections to other elements and circuits in an integrated circuit design and recorded on at least one of machine readable medium. This may be an iterative process in which netlist 580 is re-synthesized one or more times depending on design specifications and parameters for the circuit.

Design process 510 may include using a variety of inputs; for example, inputs from library elements 530 which may house a set of commonly used elements, circuits, and devices, including models, layouts, and symbolic representations, for a given manufacturing technology (e.g., different technology nodes, 32 nm, 45 nm, 50 nm, etc.), design specifications 540, characterization data 550, verification data 560, design rules 570, and test data files 585 (which may include test patterns and other testing information). Design process 510 may further include, for example, standard circuit design processes such as timing analysis, verification, design rule checking, place and route operations, etc. One of ordinary skill in the art of integrated circuit design can appreciate the extent of possible electronic design automation tools and applications used in design process 510 without deviating from the scope and spirit of the invention. The design structure of the invention is not limited to any specific design flow.

Ultimately, design process 510 preferably translates dual-gate FET 100 and/or method of making, along with the rest of the integrated circuit design (if applicable), into a final design structure 590 (e.g., information stored in a GDS storage medium). Final design structure 590 may comprise information such as, for example, test data files, design content files, manufacturing data, layout parameters, wires, levels of metal, vias, shapes, test data, data for routing through the manufacturing line, and any other data required by a semiconductor manufacturer to produce dual-gate FET 100 and/or method of making Final design structure 580 may then proceed to a stage 585 where, for example, final design structure 580 proceeds to tape-out, is released to manufacturing, is sent to another design house or is sent back to the customer.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating a field effect transistor (FET), the method comprising substantially simultaneously forming at least an upper gate in an upper gate layer of a layer stack and a lower gate in a substrate layer of the layer stack in substantial self-alignment with the upper gate, wherein the forming of at least the upper gate includes forming at least one isolation trench extending at least along two substantially parallel opposed sides of a predetermined location of the upper gate layer and from a top of the layer stack through at least the upper gate layer and into the substrate layer.

2. The method of claim 1, wherein the forming of at least the upper gate includes forming a channel in a channel layer of the layer stack between the upper gate layer and the substrate layer.

3. The method of claim 2, further comprising, after the forming of the channel, removing a portion of the substrate layer to expose a bottom surface of the channel, depositing an insulative material on the bottom surface of the channel, depositing a spacer material on a bottom surface of the insulative material, and depositing an additional insulative material on a bottom surface of the spacer material.

4. The method of claim 1, wherein at least one of the upper gate layer and the substrate layer includes single crystal silicon (Si).

5. The method of claim 1, further comprising depositing a first metal material on a top surface of the upper gate, thereby forming a Schottky barrier.

6. The method of claim 1, further comprising forming a channel layer of the layer stack by forming at least two alternating layers of respective different semiconductor materials, thereby forming at least two quantum wells.

7. The method of claim 6, wherein a first of the respective different semiconductor materials includes silicon (Si) and a second of the different semiconductor materials includes silicon germanium (SiGe).

8. A method of fabricating a field effect transistor (FET), the method comprising:
   substantially simultaneously forming an upper gate in an upper gate layer of a layer stack and a lower gate in a substrate layer of the layer stack in substantial self-alignment with the upper gate, wherein the forming of the upper gate includes:
   forming at least one isolation trench extending at least along two substantially parallel opposed sides of a predetermined location of the upper gate layer and from a top of the layer stack through at least the upper gate layer and into the substrate layer; and
   performing a lateral etch through the at least one isolation trench to substantially simultaneously form, in the at least one isolation trench, an upper lateral cavity in the upper gate layer and a lower lateral cavity in the substrate layer.

9. The method of claim 8, wherein the forming of the at least one isolation trench includes forming a channel in a channel layer of the layer stack between the upper gate layer and the substrate layer.

10. The method of claim 9, further comprising, after the forming of the channel, removing a portion of the substrate layer to expose a bottom surface of the channel, depositing an insulative material on the bottom surface of the channel, depositing a spacer material on a bottom surface of the insulative material, and depositing an additional insulative material on a bottom surface of the spacer material.

11. The method of claim 8, further comprising forming a channel layer of the layer stack by forming at least tow alternating layers of respective different semiconductor materials, thereby forming at least two quantum wells.

12. The method of claim 11, wherein a first of the respective different semiconductor materials includes silicon (Si) and a second of the different semiconductor materials includes silicon germanium (SiGe).

13. A method of fabricating a field effect transistor (FET), the method comprising:
   substantially simultaneously forming an upper gate in an upper gate layer of a layer stack and a lower gate in a substrate layer of the layer stack in substantial self-alignment with the upper gate, the layer stack including a channel layer between the upper gate layer and the lower gate layer, wherein the forming of the upper gate includes:
   forming at least one isolation trench extending at least along two substantially parallel opposed sides of a predetermined location of the upper gate layer and from a top of the layer stack through at least the upper gate layer and into the substrate layer; and
   performing a lateral etch through the at least one isolation trench to substantially simultaneously form, in the at least one isolation trench, an upper lateral cavity in the upper gate layer and a lower lateral cavity in the substrate layer, wherein the performing of the lateral etch includes forming a channel in the channel layer the lower lateral cavity defines the lower gate, and wherein the lower lateral cavity undercuts a respective end of the channel such that a top of the lower gate is narrower than the channel.

14. The method of claim 13, further comprising, after the forming of the channel, removing a portion of the substrate layer to expose a bottom surface of the channel, depositing an insulative material on the bottom surface of the channel, depositing a spacer material on a bottom surface of the insulative material, and depositing an additional insulative material on a bottom surface of the spacer material.

15. The method of claim 13, further comprising forming the channel layer of the layer stack by forming at least two alternating layers of respective different semiconductor materials, thereby forming at least two quantum wells.

16. The method of claim 15, wherein a first of the respective different semiconductor materials includes silicon (Si) and a second of the different semiconductor materials includes silicon germanium (SiGe).

\* \* \* \* \*